(12) United States Patent
Yang et al.

(10) Patent No.: US 6,590,260 B1
(45) Date of Patent: Jul. 8, 2003

(54) MEMORY DEVICE HAVING IMPROVED PROGRAMMABILITY

(75) Inventors: Nian Yang, San Jose, CA (US); John Jianshi Wang, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/103,077

(22) Filed: Mar. 20, 2002

(51) Int. Cl.⁷ .................. H01L 29/76; H01L 29/786
(52) U.S. Cl. .................. 257/347; 257/368; 257/296
(58) Field of Search .................. 257/347, 368, 257/296

(56) References Cited

U.S. PATENT DOCUMENTS

| 6,043,536 A | * | 3/2000 | Numata et al. |
| 6,195,292 B1 | * | 2/2001 | Usuki et al. |
| 6,225,668 B1 | * | 5/2001 | Shindo et al. |

* cited by examiner

*Primary Examiner*—Stephen D. Meier
(74) *Attorney, Agent, or Firm*—Wagner, Murabito & Hao LLP (57) ABSTRACT

A method for enhancing the operating characteristics of memory devices (400C), such as flash memory devices, by manipulating the Fermi energy levels of the substrate (406) and the floating gate (404). In so doing, the gap between the minimum conduction band energy level (408) and the Fermi energy level (412) of the floating gate (404) is extended so as to readily facilitate the movement of electrons from the substrate (406) into the floating gate (404).

7 Claims, 7 Drawing Sheets

MEMORY DEVICE HAVING IMPROVED PROGRAMMABILITY

TECHNICAL FIELD

The present invention relates to the field of nonvolatile memory. Specifically, embodiments of the present invention relate enhancing the operational characteristics of a memory device by manipulating the Fermi energy levels in the substrate and in the floating gate portions of the memory device.

BACKGROUND ART

Flash memory, which is sometimes called "flash RAM", is a type of non-volatile memory that can be erased and reprogrammed in units of memory called blocks. It is a variation of electrically erasable programmable read-only memory which, unlike flash memory, is erased and rewritten at the byte level, which is slower than flash memory updating. Flash memory is often used to hold control code such as Basic Input/Output System (BIOS) in a personal computer. When BIOS needs to be changed, the flash memory can be written to in block, rather than byte, sizes, making it easy and fast to update.

Flash memory is used in digital cellular phones, digital cameras, LAN switches, PC Cards for notebook computers, digital set-up boxes, embedded controllers, and other devices.

Flash memory gets its name from the organization of the microchip, which allows a section of the memory cells to be erased in a single action or "flash". In one approach, the erasure is caused by hot electrons injected from the drain junction, in which electrons pierce through a thin dielectric material, resulting in the removal of an electronic charge from a floating gate associated with each memory cell. The floating gate stores the charge being programmed.

In one approach, programming is achieved by electron charge injection from the channel area of the drain junction. Although programming is achieved in the conventional floating gate memory, in certain devices programming is not readily conducted, as it is difficult to move electrons between the substrate and the floating gate. This difficulty in the electrons moving between the substrate and the floating gate region adversely affects the programming efficiency. Therefore, the use of the conventional floating gate memory is non-ideal. Accordingly, what is needed is a floating gate memory that can be programmed more easily than the conventional floating gate memory.

DISCLOSURE OF INVENTION

The present invention provides a method and device that can achieve greater memory programmability than that of the conventional floating gate memory of the background art.

In various embodiments, the present invention presents a method for enhancing the operational characteristics of a memory device that comprises manipulating the Fermi energy level of a floating gate portion of the memory device such that the floating gate portion attains a first Fermi energy level. Additionally, the Fermi energy level of a substrate portion of the memory device is manipulated such that the substrate portion attains a second Fermi energy level, wherein the first and second Fermi energy levels differ such that the movement of electrons between the substrate and the floating gate is readily facilitated.

In one embodiment, the manipulation of the Fermi energy level of the floating gate is accomplished through fabricating the floating gate of a material comprising an undoped polysilicon material. In one embodiment, the manipulation of the Fermi energy level of the floating gate is accomplished through fabricating the floating gate of a material comprising an undoped polysilicon germanium material.

In another embodiment, the manipulation of the Fermi energy level of the floating gate is accomplished through fabricating the floating gate of a material comprising a p-type doped polysilicon material. In yet another embodiment, the manipulation of the Fermi energy level of the floating gate is accomplished through fabricating the floating gate of a material comprising an p-type doped polysilicon germanium material. In one embodiment, the p-type dopant material is boron.

In one embodiment, the manipulation of the Fermi energy level of the substrate is accomplished through fabricating the substrate of a material comprising a p-type doped polysilicon material.

Other features and advantages of the invention will become apparent to those of ordinary skill in the art after having read the following detailed description of the preferred embodiments taken in conjunction with the accompanying drawings, illustrating by way of example the principles of the invention.

BRIEF DESCRIPTION OF DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

MODE(S) FOR CARRYING OUT THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

When the programming of a floating memory device (e.g., flash memory) is achieved by electron charge injection from the channel area of the drain junction, the position of the Fermi energy level of the floating gate affects the programming efficiency significantly. During the programming, the electrons will tunnel through the tunnel oxide and reside in the conduction energy band of the floating gate. The occupation of the conduction energy band obeys Fermi distribution. Thus, the closer the Fermi level to the conduction energy band, the harder it becomes for the electron to tunnel onto the conduction energy band of the floating gate. Therefore it is desirable to manipulate the Fermi energy level of the floating gate and that of the substrate so as to achieve a separation that will enhance the programmability of the device.

Figure 1:
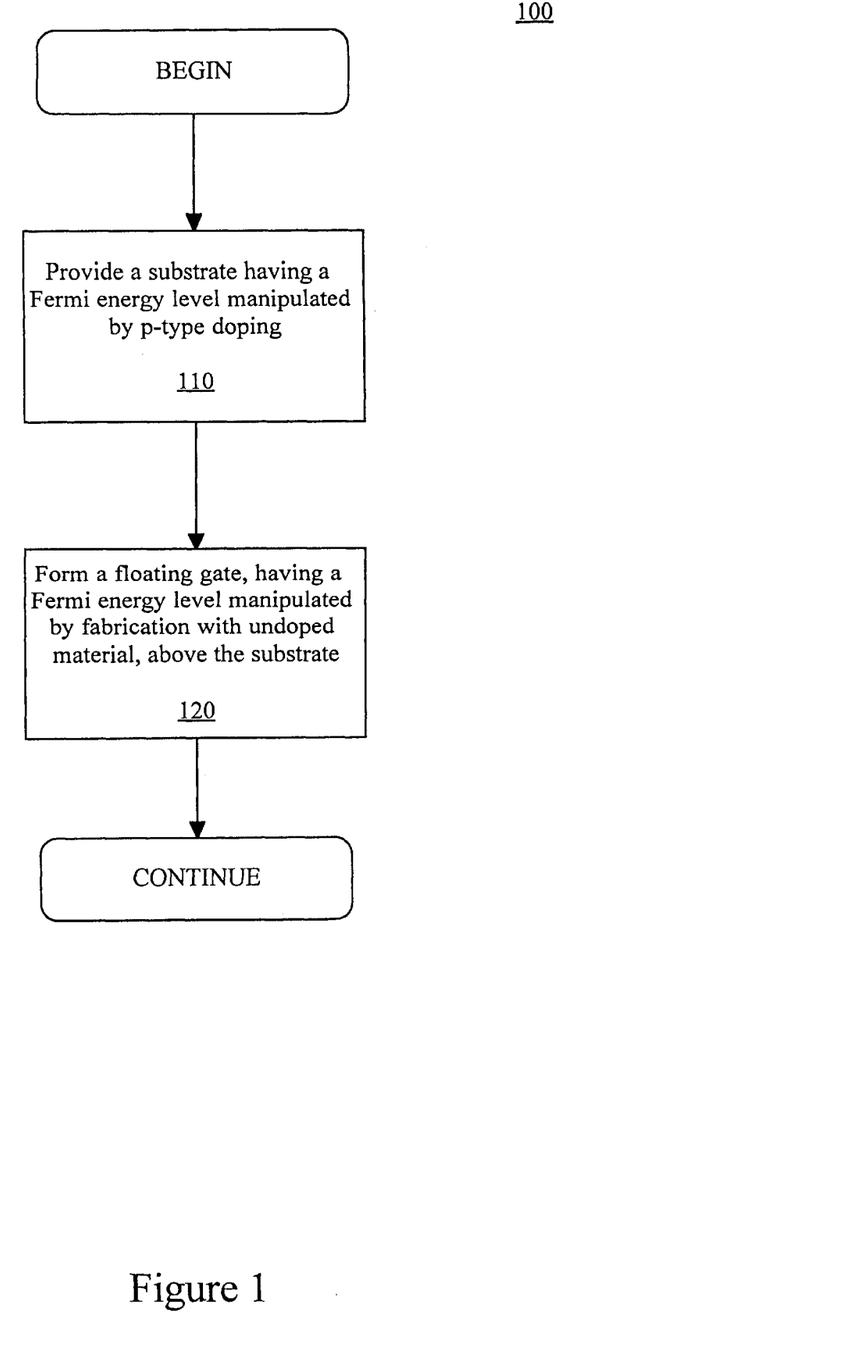
FIG. 1 is a flow diagram of a method, in accordance with one embodiment of the present invention, for enhancing the operational characteristics of a memory device.

FIG. 1 is a flow diagram 100 of steps performed, in accordance with one embodiment of the present invention, in a method for enhancing the operational characteristics (i.e., programmability) of a memory device. Flow diagram 100 includes processes of the present invention for enhancing the operational characteristics of a floating gate memory device such as device 200A illustrated in FIG. 2A. At step 110 a substrate (e.g., p-type substrate 206 of FIG. 2A) is provided. This substrate provides a base for the floating gate memory device 200A and, according to one embodiment, is comprised of a slightly p-type doped polysilicon material.

Figure 2A:
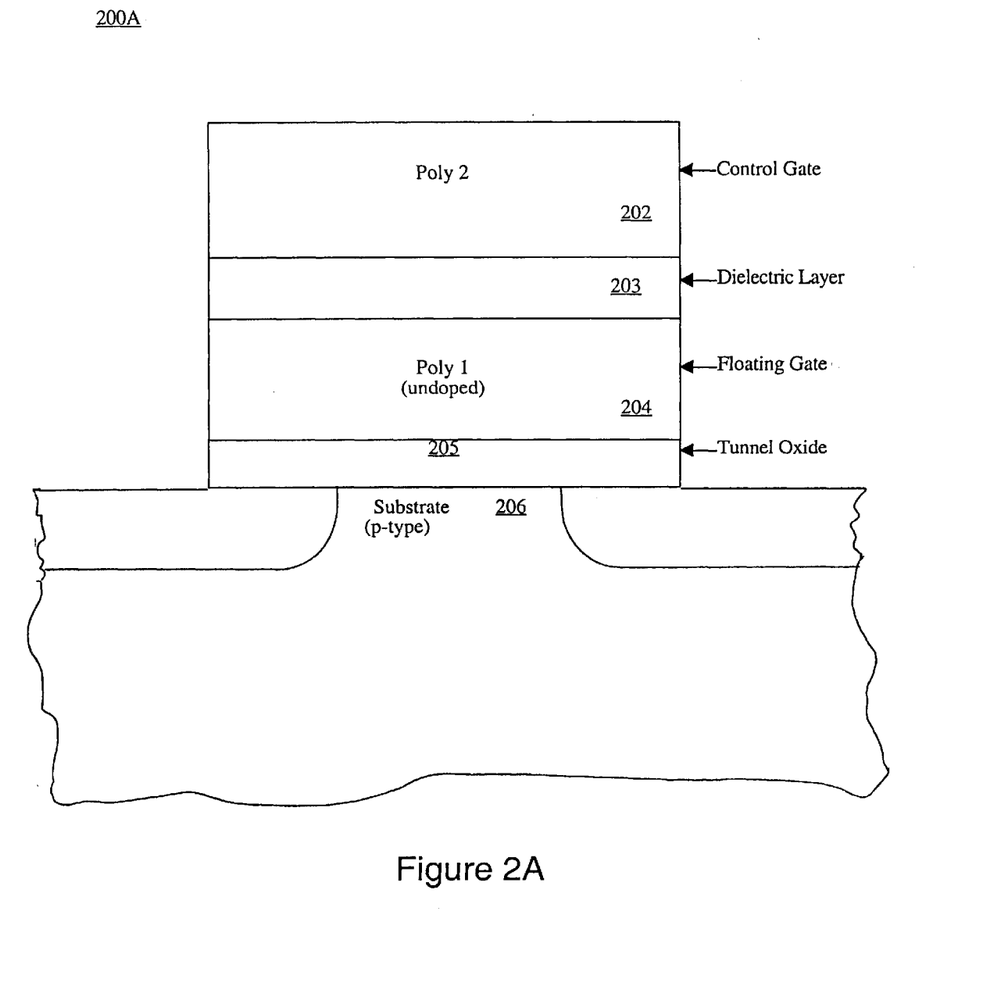
FIG. 2A illustrates a memory device, in accordance with one embodiment of the present invention.

At step 120 of FIG. 1, a floating gate (e.g., floating gate 204 of FIG. 2A) is formed above a tunnel oxide layer (e.g., tunnel oxide 205 of FIG. 2A). When sufficient field strength is present, electrons can tunnel through tunnel oxide layer 205 and into floating gate 204. In order to provide for sufficient field strength, according to an embodiment of the present invention, the Fermi energy level of the floating gate is manipulated so as to readily facilitate the movement of electrons between substrate 206 and floating gate 204. According to one embodiment, the manipulation of the Fermi energy level is achieved through the use of an undoped polysilicon material. According to another embodiment, the manipulation of the Fermi energy level is achieved through the use of an undoped polysilicon germanium material. By this manipulation of the Fermi energy levels, the programming characteristics of the device are enhanced. Specifically, Fermi energy levels are important for the movement of electrons between the substrate and the floating gate. Although specific steps are disclosed in flowchart 100, such steps are exemplary. That is, the present invention is well suited to performing various other steps or variations of the steps recited in FIG. 1.

FIG. 2A illustrates a flash memory device 200A, according to one embodiment of the present invention. This flash memory device 200A is a non-volatile memory device. Although this memory device is shown as a flash memory device for illustration, brevity, and clarity, it should be understood that other devices could be employed in conjunction with the present invention. Flash memory device 200A has a p-type doped substrate 206 above which a thin oxide layer 205, known as tunnel oxide, has been formed. Tunnel oxide layer 205 allows electrons, when sufficient field strength is applied, to tunnel through into a floating gate, 204. In this embodiment of the present invention, floating gate 204 is an undoped or intrinsic polysilicon, herein called Poly 1. Alternatively, in another embodiment of the present invention, floating gate 204 may be comprised of undoped polysilicon germanium. It is this floating gate 204 that is programmed by the addition or removal of electrons therein.

A polysilicon control gate 202, herein called Poly 2, is separated from floating gate 204 by a dielectric layer 203 such as Oxy-Nitride Oxide (ONO). This dielectric layer 203 serves to insulate floating gate 204 from control gate 202. It should be understood that, although ONO is being shown for illustration and clarity, any dielectric material suitable for insulating floating gate 204 from control gate 202 may be used.

Figure 2B:
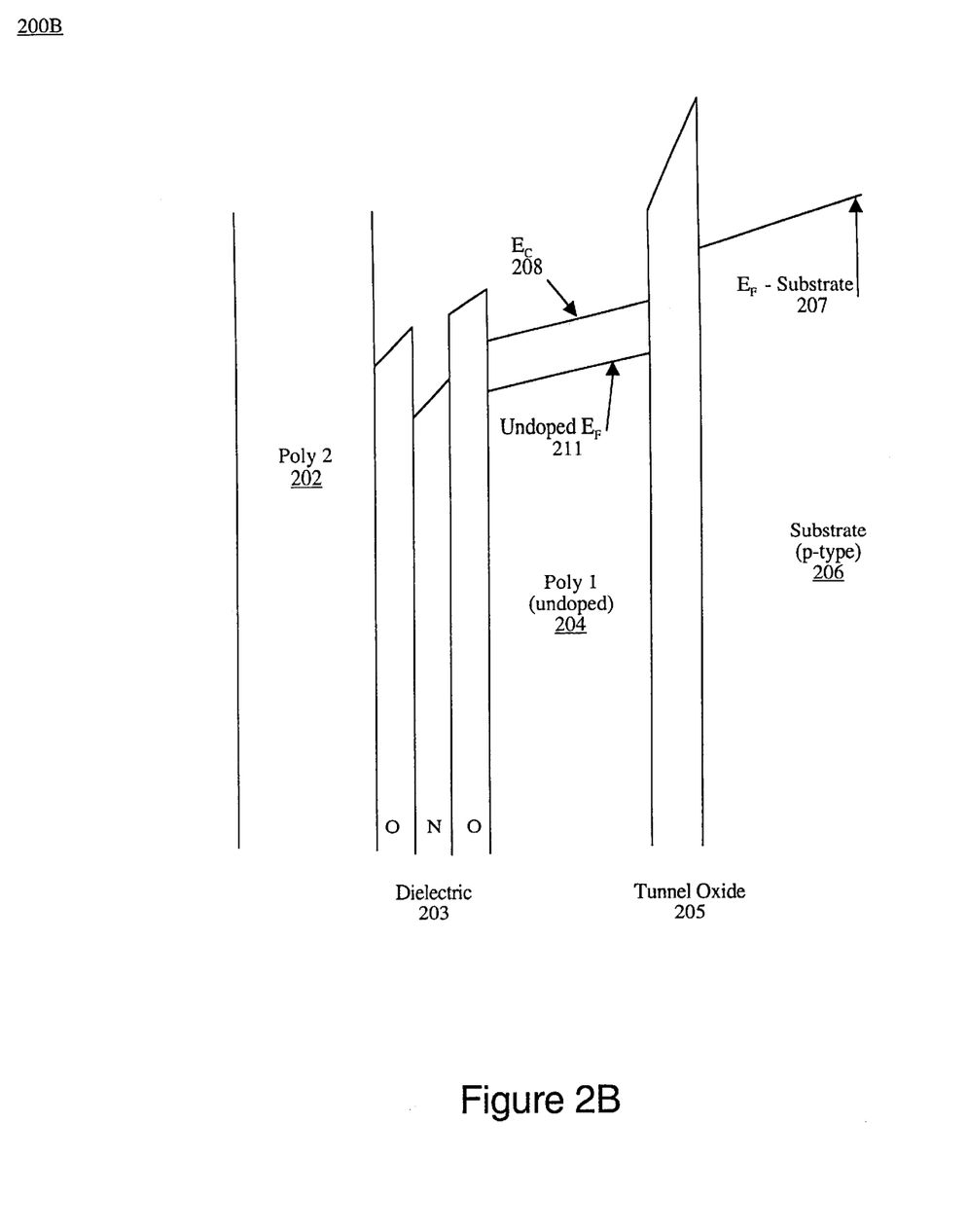
FIG. 2B illustrates the relative positions of the energy levels of layers of the memory device of FIG. 2A, in accordance with one embodiment of the present invention.

FIG. 2B illustrates the relative positions of the energy levels of the layers of the flash memory device 200A of FIG. 2A when there is a programming gate bias on the Poly 2 of control gate 202. A tunnel oxide 205 resides above p-type substrate 206. According to this embodiment, a Poly 1 undoped polysilicon floating gate 204 is then formed above the tunnel oxide 205. Above floating gate 404 is an ONO layer, 203, separating floating gate 204 from control gate 202. It should be understood that, although ONO is being shown for illustration and clarity, any dielectric material suitable for insulating floating gate 204 from control gate 202 may be used.

Still referring to FIG. 2B, the Fermi energy level $E_F$ 207 of substrate 206, when a programming gate bias is applied to poly 2 control gate 202, is depicted. Fermi energy level $E_F$ 211 of the intrinsic undoped polysilicon floating gate 204 when the programming gate bias is applied to control gate 202 is shown, in accordance with one embodiment of the present invention. The gap between Fermi energy level $E_F$ 211 of the undoped floating gate, the Fermi energy level $E_F$ 207 of substrate 206, and the minimum conduction energy band 208 with pragramming gate bias applied to control gate 202 results in a configuration which allows electrons to move readily between substrate 206 and floating gate 204. By this manipulation of the Fermi energy levels, the programming characteristics of the device are enhanced.

Figure 3:
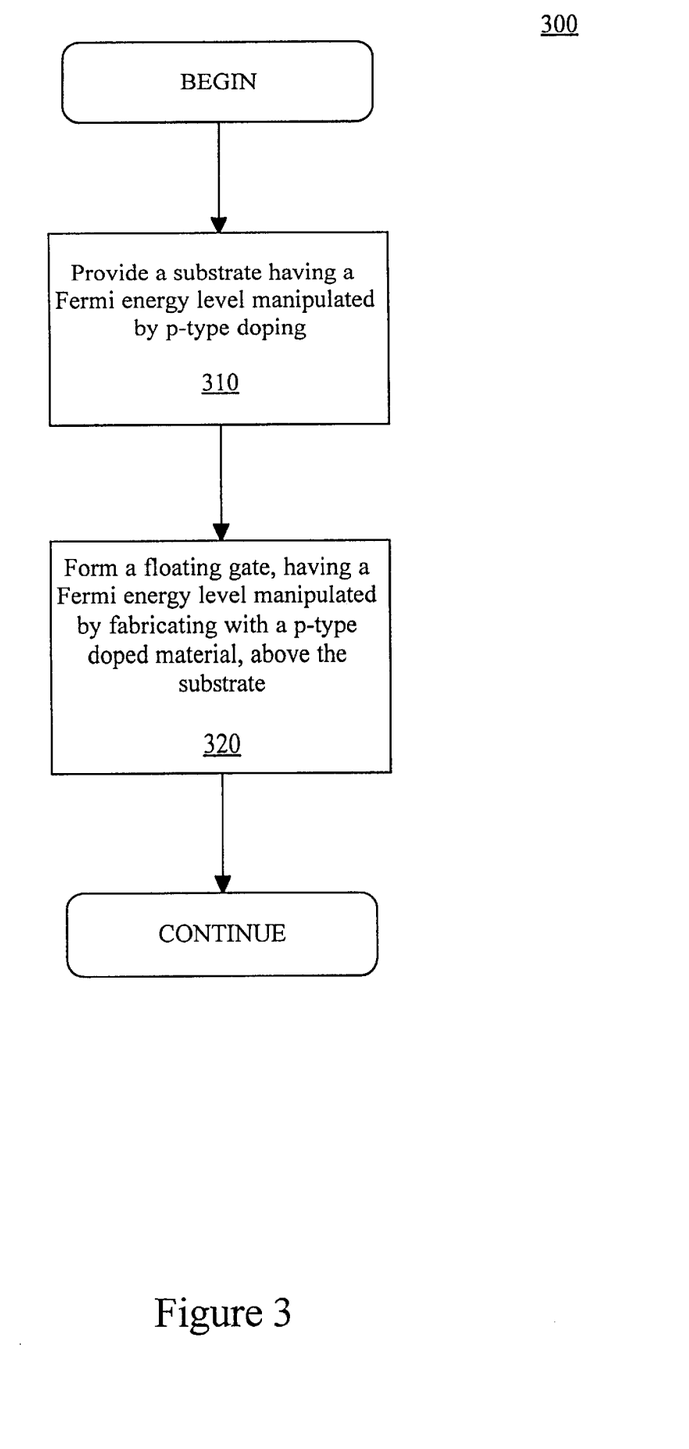
FIG. 3 is a flow diagram, in accordance with one embodiment of the present invention, of a method for fabricating a memory device.

FIG. 3 is a flow diagram 300 of steps performed in fabricating a memory device, in accordance with one embodiment of the present invention. Flow diagram 300 includes processes of the present invention for enhancing the operational characteristics of a floating gate memory device such as device 400A and 400B illustrated in FIGS. 4A and 4B, respectively. At step 310 a substrate (e.g., p-type substrate 406 of FIG. 4A) is provided. This substrate provides a base for floating gate memory device 400A and, according to one embodiment, is comprised of a slightly p-type doped polysilicon material.

Figure 4A:
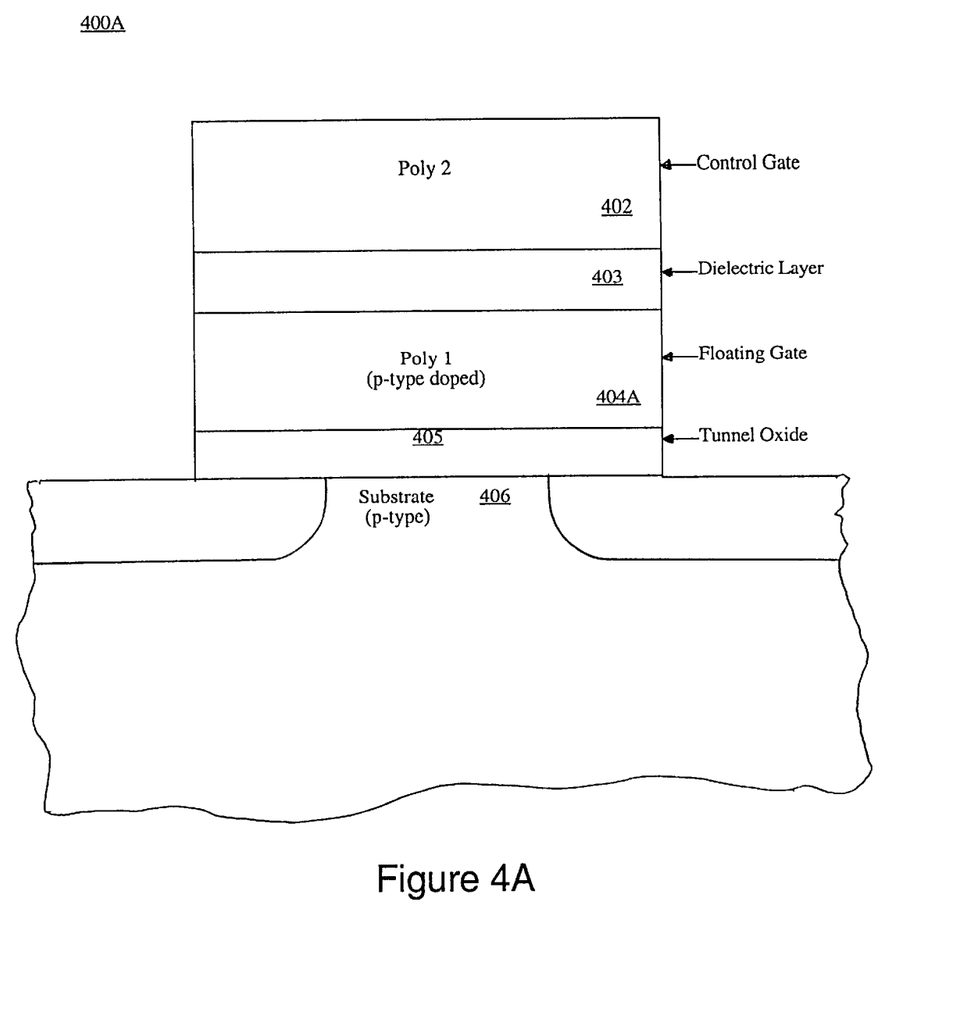
FIG. 4A illustrates a memory device in accordance with one embodiment of the present invention, showing a floating gate comprised of a p-type doped polysilicon semiconductor material.

At step 320 of FIG. 3, a floating gate (e.g., floating gate 404 of FIG. 4A) is formed above a tunnel oxide layer (e.g., tunnel oxide 405 of FIG. 4A). When sufficient field strength is present, electrons can tunnel through tunnel oxide layer 405 and into floating gate 404. In order to provide for sufficient field strength, according to an embodiment of the present invention, the Fermi energy level of floating gate 404 is manipulated so as to readily facilitate the movement of electrons between substrate 406 and floating gate 404. According to one embodiment, the manipulation of the Fermi energy level is achieved through the use of a p-type doped polysilicon material. According to another embodiment, the manipulation of the Fermi energy level is achieved through the use of an p-type doped polysilicon germanium material. By this manipulation of the Fermi energy levels, the programming characteristics of the device are enhanced. Specifically, Fermi energy levels are important for the movement of electrons between the substrate and the floating gate. Although specific steps are disclosed in flowchart 300, such steps are exemplary. That is, the present invention is well suited to performing various other steps or variations of the steps recited in FIG. 3.

FIG. 4A illustrates a flash memory device 400A, according to one embodiment of the present invention. This flash memory device 400A is a non-volatile memory device. Although this memory device is shown as a flash memory device for illustration, brevity, and clarity, it should be understood that other devices could be employed in conjunction with the present invention. Flash memory device 400A has a p-type doped substrate 406 above which a thin oxide layer 405, known as tunnel oxide, has been formed. Tunnel oxide layer 405 allows electrons, when sufficient field strength is applied, to tunnel through into a floating gate, 404A. In this embodiment of the present invention, floating gate 404A is a p-type doped polysilicon. It is this floating gate 404A that is programmed by the addition or removal of electrons therein.

A polysilicon control gate 402, herein called Poly 2, is separated from floating gate 404A by a dielectric layer 403 such as Oxy-Nitride Oxide (ONO). This dielectric layer 403 serves to insulate floating gate 404A from control gate 402. It should be understood that, although ONO is being shown for illustration and clarity, any dielectric material suitable for insulating floating gate 404A from control gate 402 may be used.

Figure 4B:
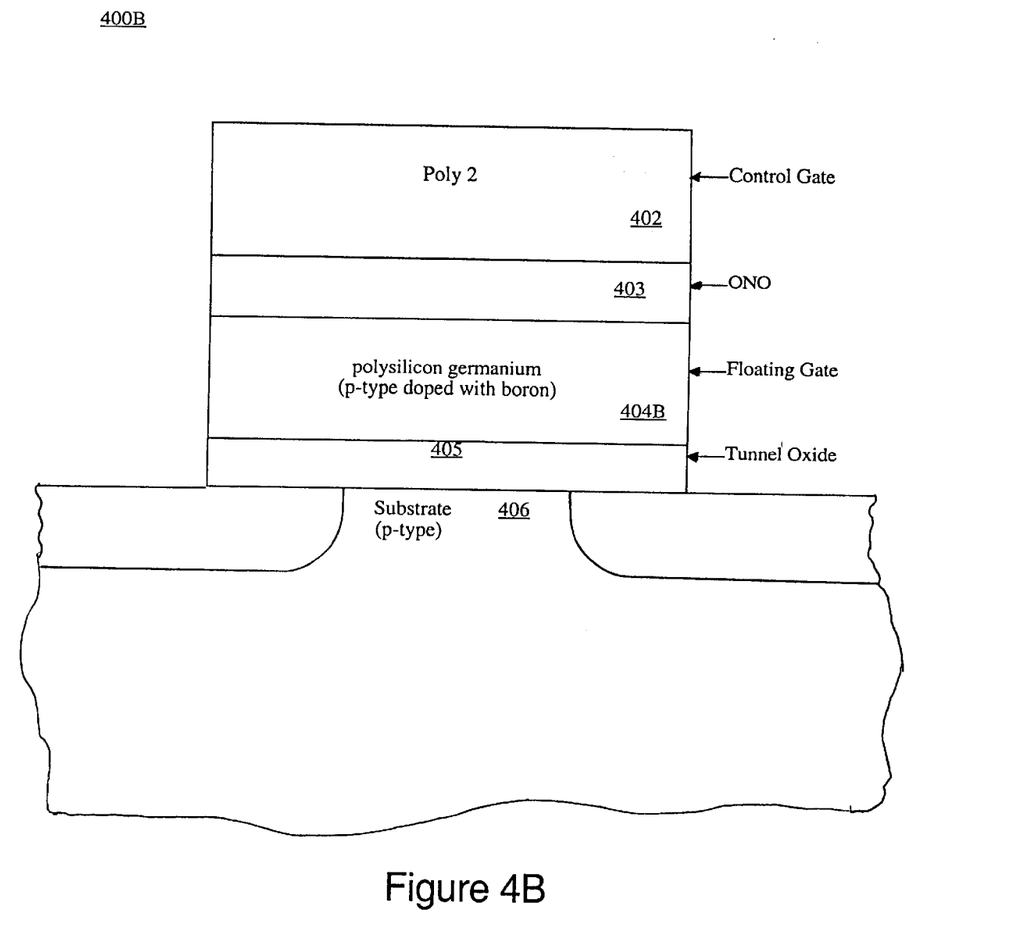
FIG. 4B illustrates a memory device in accordance with one embodiment of the present invention, showing a floating gate comprised of a p-type doped polysilicon germanium semiconductor material for prevention of boron penetration through the tunnel oxide layer.

FIG. 4B illustrates a flash memory device 400B in accordance with one embodiment of the present invention. This flash memory device 400B is a non-volatile memory device. Although this memory device is shown as a flash memory device for illustration, brevity, and clarity, it should be understood that other devices could be employed in conjunction with the present invention. Flash memory device 400B has a p-type doped substrate 406 above which a thin oxide layer 405, known as tunnel oxide, has been formed. Tunnel oxide layer 405 allows electrons, when sufficient field strength is applied, to tunnel through into a floating gate, 404B. In this embodiment of the present invention, floating gate 404B is comprised of a polysilicon germanium material having a p-type dopant, such as boron, applied. Boron is one example of a p-type dopant that may be used. It should be understood that other p-type dopant materials could be employed in conjunction with the present invention. The boron, in accordance with the present embodiment, due to its small atomic size, has a disadvantage of penetrating through tunnel oxide 405 to disrupt the structure of substrate 406. Germanium forms a tighter structure for floating gate 404B that blocks boron from penetrating through tunnel oxide 405. Therefore, according to the present embodiment of the present invention, polysilicon germanium is used for floating gate 404B when boron is used as the p-type dopant. In one embodiment, floating gate 404B is comprised of approximately 70% polysilicon and 30% germanium.

A polysilicon control gate 402, herein called Poly 2, is separated from floating gate 404B by a dielectric layer 403 such as Oxy-Nitride Oxide (ONO). This dielectric layer 403 serves to insulate floating gate 404B from control gate 402. It should be understood that, although ONO is being shown for illustration and clarity, any dielectric material suitable for insulating floating gate 404B from control gate 402 may be used.

Figure 4C:
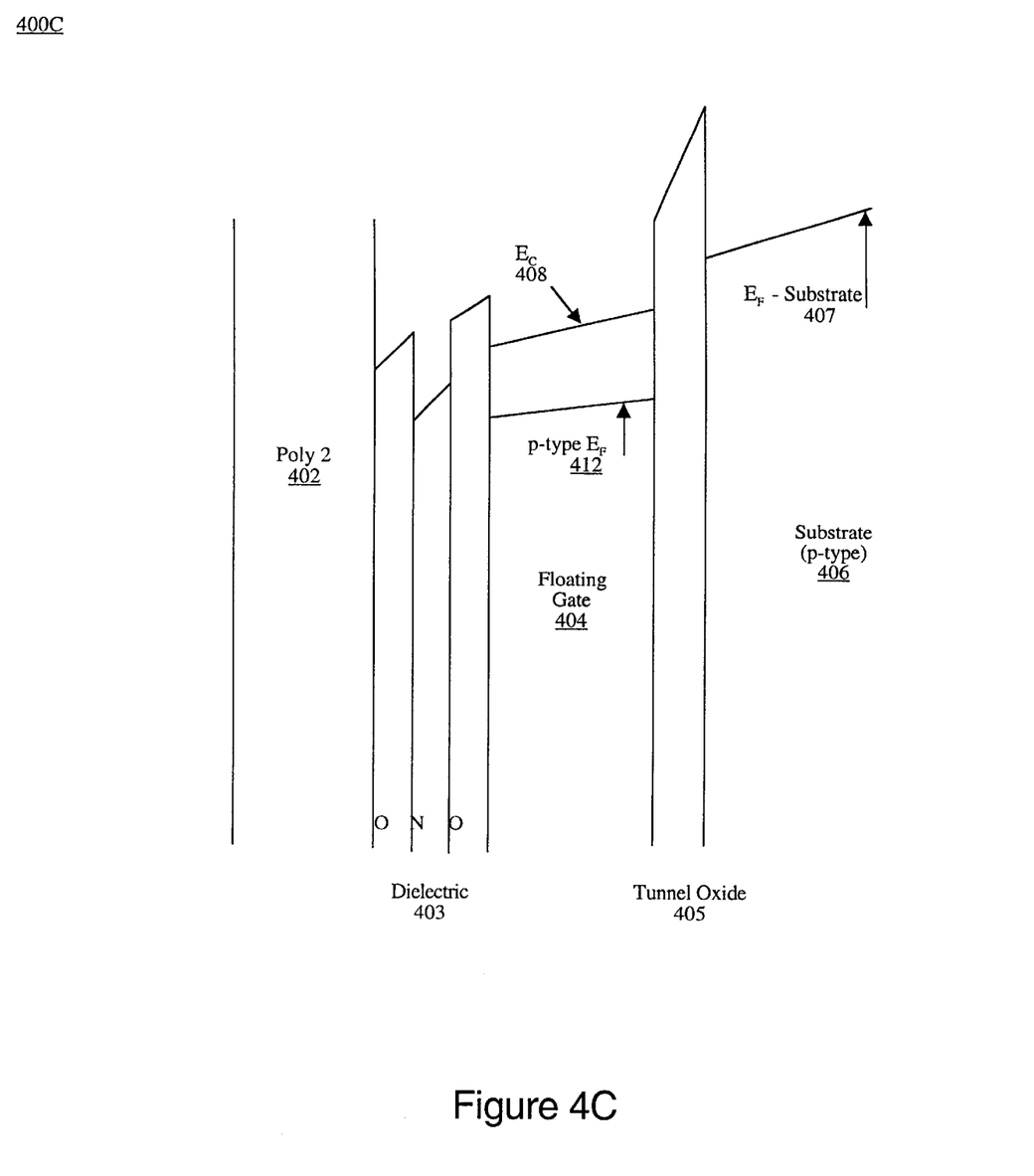
FIG. 4C illustrates the relative positions of the energy levels of the layers of the memory devices of FIGS. 4A and 4B in accordance with one embodiment of the present invention.

FIG. 4C illustrates the relative positions of the energy levels of the memory devices 400A and 400B when a programming gate bias is applied to Poly 2 control gate 202, described in conjunction with FIGS. 4A and 4B. Tunnel oxide layer 405 resides above P-type substrate 406. P-type doped polysilicon germanium floating gate 404 (or p-type doped polysilicon of FIG. 400A) is then formed above tunnel oxide 405. Above floating gate 404 is dielectric layer 403, separating floating gate 404 from control gate 402. It should be understood that, although ONO is being shown for illustration and clarity, any dielectric material suitable for insulating floating gate 204 from control gate 202 may be used.

Still referring to FIG. 4C, line 407 represents the Fermi energy level $E_F$ of substrate 406. The line 412 represents the relative Fermi energy level $E_F$ of a p-type doped floating gate 404 as described in FIGS. 4A and 4B. Line 412 representing the Fermi energy level $E_F$ of the p-type doped polysilicon floating gate 404A (or p-type doped polysilicon germanium floating gate 404B) is separated, when the programming gate bias is applied to control gate 202, from conduction band energy level 408 and Fermi energy level $E_F$-substrate sufficiently to readily allow electrons to tunnel between substrate 406 and floating gate 404 at a given field strength. The separation of the Fermi energy levels through manipulation of substrate 406 and floating gate 404 improves the ability for electrons to flow into the floating gate, thereby enhancing the operational characteristics, specifically the programmability, of the memory device.

In summary, embodiments of the present invention provide a method for enhancing the operational characteristics of a memory device by manipulating the Fermi energy level of the floating gate with respect to the Fermi energy level of the substrate within the device. By this manipulation embodiments of the present invention enhance the programming characteristics. Specifically, Fermi energy levels are important for the movement of electrons.

The present invention has been described in the context of a flash memory device; however, the present invention may also be implemented in other types of memory devices having, for example, a floating gate and a control gate, such that the device performs certain functions on behalf of a processor. Furthermore, it is appreciated that these certain functions may include functions other than those associated with memory devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching, The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory device (400C) comprising:
   a floating gate (404) having a first manipulated Fermi energy level;
   a substrate (406) having a second manipulated Fermi energy level;
   said first and second manipulated Fermi energy levels differing such that the movement of electrons between said substrate (406) and said floating gate (404) is readily facilitated.

2. A device as recited in claim 1 wherein said floating gate (404) comprises an undoped polysilicon material.

3. A device as recited in claim 1 wherein said floating gate (404) comprises an undoped polysilicon germanium material.

4. A device as recited in claim 1 wherein said floating gate (404) comprises a polysilicon material and a p-type dopant material.

5. A device as recited in claim 1 wherein said floating gate (404) comprises a polysilicon germanium material and a p-type dopant material.

6. A device as recited in claim 5 wherein said p-type dopant material is boron.

7. A device as recited in claim 1 wherein said substrate (406) comprises a p-type polysilicon.

* * * * *